(12) United States Patent
Matsuda et al.

(10) Patent No.: US 11,522,515 B2
(45) Date of Patent: Dec. 6, 2022

(54) ACOUSTIC WAVE DEVICE INCLUDING INTERDIGITAL ELECTRODES COVERED BY SILICON OXYNITRIDE FILM

(71) Applicant: SKYWORKS SOLUTIONS, INC., Irvine, CA (US)

(72) Inventors: Satoru Matsuda, Toyonaka (JP); Atsushi Nishimura, Nishinomiya (JP); Yoshiro Kabe, Kobe (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 1302 days.

(21) Appl. No.: 15/922,355

(22) Filed: Mar. 15, 2018

(65) Prior Publication Data

US 2018/0269848 A1 Sep. 20, 2018

Related U.S. Application Data

(60) Provisional application No. 62/522,577, filed on Jun. 20, 2017, provisional application No. 62/472,184, filed on Mar. 16, 2017.

(51) Int. Cl.
*H03H 9/02* (2006.01)
*H03H 9/17* (2006.01)
*H03H 3/10* (2006.01)

(52) U.S. Cl.
CPC .......... *H03H 9/02535* (2013.01); *H03H 3/10* (2013.01); *H03H 9/02007* (2013.01); *H03H 9/02834* (2013.01); *H03H 9/171* (2013.01)

(58) Field of Classification Search
CPC .......... H03H 9/02834; H03H 9/02535; H03H 9/171; H03H 9/02007; H03H 3/10
See application file for complete search history.

(56) References Cited

U.S. PATENT DOCUMENTS

| | | | |
|---|---|---|---|
| 7,339,304 B2 | 3/2008 | Kadota et al. | |
| 7,411,334 B2 | 8/2008 | Nishiyama et al. | |
| 8,035,460 B2 | 10/2011 | Nakanishi et al. | |
| 9,048,813 B2 | 6/2015 | Iwasaki et al. | |
| 9,065,424 B2 | 6/2015 | Nakanishi et al. | |
| 9,159,900 B2 | 10/2015 | Tamasaki | |
| 9,431,996 B2 | 8/2016 | Watanabe et al. | |
| 9,584,088 B2 | 2/2017 | Kikuchi et al. | |
| 2007/0018536 A1 | 1/2007 | Kadota et al. | |
| 2007/0210676 A1 | 9/2007 | Matsuda et al. | |
| 2009/0267449 A1 | 10/2009 | Goto et al. | |

(Continued)

FOREIGN PATENT DOCUMENTS

| JP | 2011-061743 A | 3/2011 |
|---|---|---|
| JP | 2011-254549 A | 12/2011 |

(Continued)

*Primary Examiner* — J. San Martin
(74) *Attorney, Agent, or Firm* — Lando & Anastasi, LLP

(57) ABSTRACT

An acoustic wave device includes a piezoelectric substrate, a pair of interleaved interdigital transducer electrodes disposed on the piezoelectric substrate, and a dielectric film including silicon oxynitride covering the pair of interleaved interdigital transducer electrodes. The dielectric film exhibits a temperature coefficient of velocity of substantially zero throughout an operating temperature range of the acoustic wave device of between −55° C. and 125° C.

19 Claims, 6 Drawing Sheets

(56) References Cited

U.S. PATENT DOCUMENTS

| | | | | |
|---|---|---|---|---|
| 2010/0187947 A1* | 7/2010 | Mimura | ............... | H03H 9/0222 |
| | | | | 310/365 |
| 2011/0050034 A1* | 3/2011 | Yamane | ............... | H03H 9/0222 |
| | | | | 310/313 C |
| 2012/0274179 A1* | 11/2012 | Nodake | ................... | H01L 41/27 |
| | | | | 29/25.35 |
| 2013/0029033 A1* | 1/2013 | Kikuchi | .............. | C23C 14/3407 |
| | | | | 427/100 |
| 2013/0285504 A1* | 10/2013 | Tamasaki | ............. | H03H 9/6483 |
| | | | | 310/313 C |
| 2018/0041186 A1* | 2/2018 | Yamaji | ............... | H03H 9/02929 |

FOREIGN PATENT DOCUMENTS

| WO | 2008-146449 A1 | 12/2008 |
|---|---|---|
| WO | 2011074464 A1 | 6/2011 |

\* cited by examiner

ACOUSTIC WAVE DEVICE INCLUDING INTERDIGITAL ELECTRODES COVERED BY SILICON OXYNITRIDE FILM

CROSS-REFERENCE TO RELATED APPLICATIONS

This application claims priority under 35 U.S.C. § 119(e) to U.S. Provisional Application Ser. No. 62/472,184, titled "ACOUSTIC WAVE DEVICE INCLUDING INTERDIGITAL ELECTRODES COVERED BY SILICON OXYNITRIDE FILM," filed Mar. 16, 2017 and to U.S. Provisional Application Ser. No. 62/522,577, titled "ACOUSTIC WAVE DEVICE INCLUDING INTERDIGITAL ELECTRODES COVERED BY SILICON OXYNITRIDE FILM," filed Jun. 20, 2017. Each of these applications is incorporated herein in its entirety for all purposes.

BACKGROUND

In the field of information communication devices, such as mobile phones, for example, acoustic wave devices having comb-shaped interdigital transducer (IDT) electrodes formed on a piezoelectric substrate are used as circuit elements such as resonators, filters, and the like. FIGS. 1A and 1B show an example of such an acoustic wave device. In FIG. 1A, a top plan view of an acoustic wave device 10 is shown. The acoustic wave device 10 is formed by arranging two IDT electrodes 15 and two reflectors 20 on a piezoelectric substrate 25. The IDT electrodes 15 each have a busbar 30 and a plurality of electrode fingers 35 that extend from the busbar 30. The respective electrode fingers 35 of each of the IDT electrodes 15 are arranged such that the electrode fingers 35 thereof are arranged interleaved with the respective electrode fingers 35 of the other IDT electrode 15. The reflectors 20 are arranged so as to interpose the IDT electrodes 15 therebetween in a direction of propagation of an acoustic wave through the device, as shown in FIG. 1A. As illustrated in FIG. 1B, the IDT electrodes are typically covered by a dielectric film 40 to protect the IDT electrodes and/or to adjust characteristics of the acoustic wave device. For example, the dielectric film 40 may be used to adjust the frequency response of the acoustic wave device or to compensate for changes in performance or characteristics of the device due to changes in temperature.

SUMMARY

In accordance with an aspect of the present disclosure, there is provided an acoustic wave device. The acoustic wave device comprises a piezoelectric substrate, a pair of interleaved interdigital transducer electrodes disposed on the piezoelectric substrate, and a dielectric film including or consisting of silicon oxynitride covering the pair of interleaved interdigital transducer electrodes. The dielectric film exhibits a temperature coefficient of velocity of substantially zero throughout an operating temperature range of the acoustic wave device of between −55° C. and 125° C.

In some embodiments, the acoustic wave device further includes a second dielectric film disposed between the dielectric film including silicon oxynitride and the pair of interleaved interdigital transducer electrodes. The second dielectric film may exhibit a temperature coefficient of velocity having a sign opposite to a temperature coefficient of velocity of the piezoelectric substrate. The temperature coefficient of velocity of the second dielectric film may be positive. The second dielectric film may exhibit the temperature coefficient of velocity having the sign opposite to the temperature coefficient of velocity of the piezoelectric substrate throughout the operating temperature range of the acoustic wave device. The temperature coefficient of velocity of the second dielectric film may be more negative than the temperature coefficient of velocity of the dielectric film including silicon oxynitride. The second dielectric film may comprise or consist of silicon dioxide.

In some embodiments, the second dielectric film is in direct contact with the pair of interleaved interdigital transducer electrodes. The second dielectric film may be in direct contact with the dielectric film including silicon oxynitride. The second dielectric film may be in direct contact with the piezoelectric substrate.

In some embodiments, the acoustic wave device is one of a resonator and a filter. The acoustic wave device may be one of a radio frequency resonator and a radio frequency filter.

In some embodiments, the acoustic wave device is included in an electronic device module. The electronic device module may be a radio frequency device module. The acoustic wave device may be included in an electronic device.

In accordance with another aspect, there is provided an acoustic wave device. The acoustic wave device comprises a piezoelectric substrate, a pair of interleaved interdigital transducer electrodes disposed on the piezoelectric substrate, and a dielectric film including or consisting of silicon oxynitride covering the pair of interleaved interdigital transducer electrodes. The dielectric film may have a N/(N+O) ratio of less than or equal to 0.1, N being the atomic percentage of nitrogen in the dielectric film and O being the atomic percentage of oxygen in the dielectric film.

In some embodiments, the dielectric film has a positive temperature coefficient of velocity.

The acoustic wave device may further comprise a second dielectric film disposed between the dielectric film including silicon oxynitride and the pair of interleaved interdigital transducer electrodes.

In accordance with another aspect, there is provided a method of forming an acoustic wave device. The method comprises forming a pair of interleaved interdigital transducer electrodes on a piezoelectric substrate and depositing a dielectric film including or consisting of silicon oxynitride over the pair of interleaved interdigital transducer electrodes. The dielectric film may exhibit a temperature coefficient of velocity of substantially zero throughout an operating temperature range of the acoustic wave device of between −55° C. and 125° C.

The method may further comprise forming a silicon dioxide film between the dielectric film and the pair of interleaved interdigital transducer electrodes.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Commonly used cellular phones have built-in high-frequency filters used for a variety of purposes. These filters can be made using acoustic wave devices formed on piezoelectric bodies. To make filters with a large quality factor (Q factor), research is being carried out in the pursuit of piezoelectric bodies with higher piezoelectric performance. However, even if high-efficiency filters with high piezoelectric performance are made, when the temperature of the filter changes, the velocity of sound through the piezoelectric body (referred to herein as "sound velocity") may change as well. This can in turn change the performance and characteristics of the acoustic wave devices, and filters including same, such that signals at target frequencies can no longer be obtained. This problem may be addressed by coating the piezoelectric body substrate with temperature-compensating films. However, even in acoustic wave devices with temperature-compensating films, it may be desirable to further improve the temperature coefficient of frequency (TCF) of the acoustic wave device, which is a measure of how the frequency response of the device changes with changing temperatures.

Figure 1A:
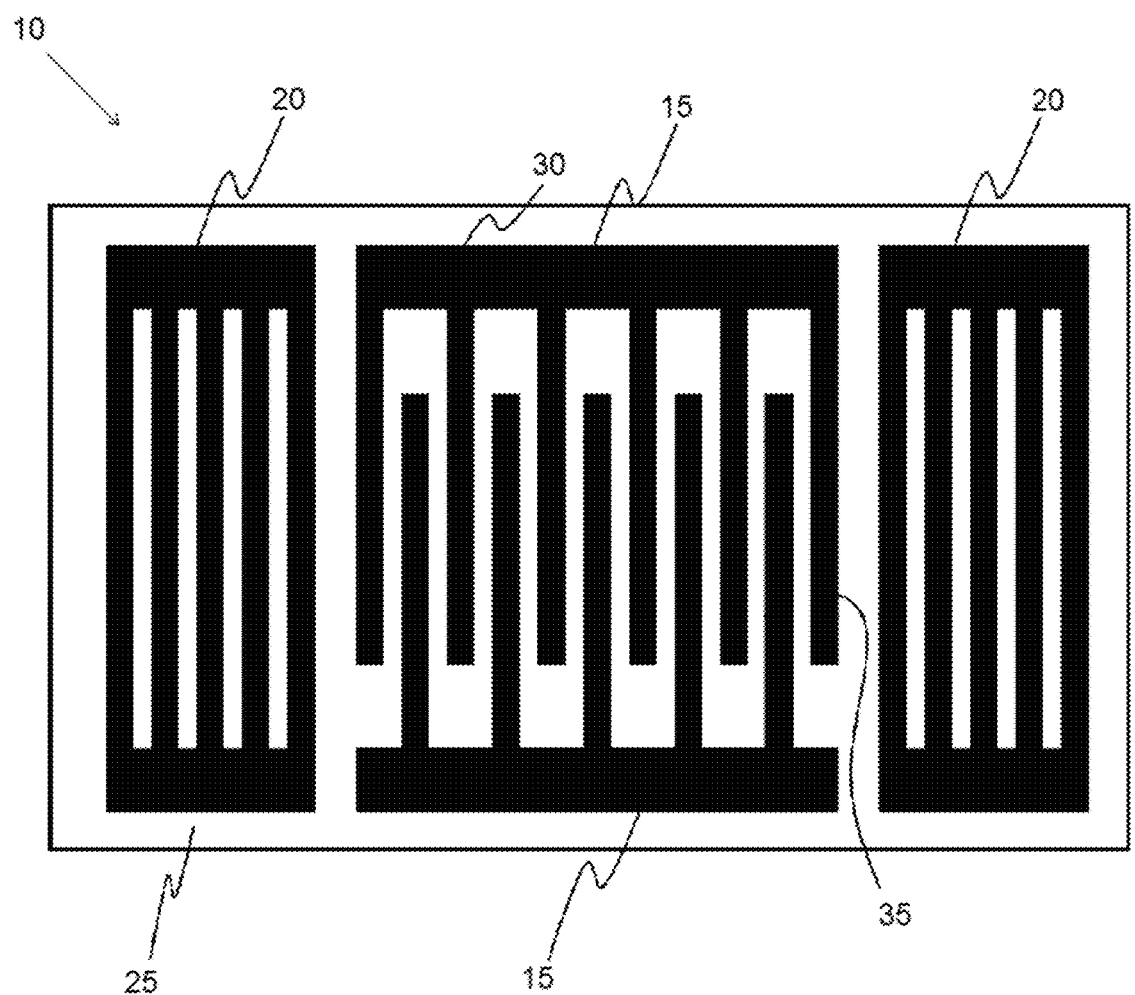
FIG. 1A in a plan view of an example of an acoustic wave device.
Figure 1B:
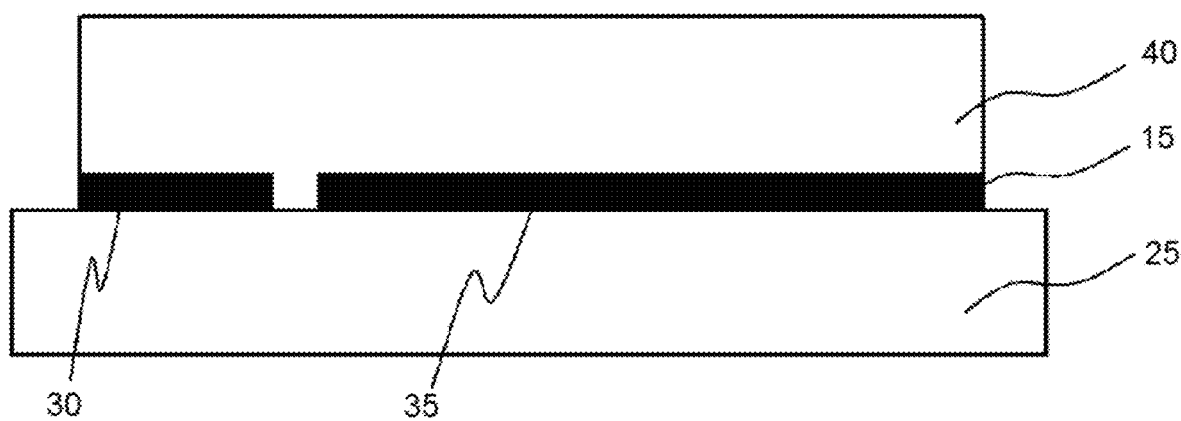
FIG. 1B is a cross-sectional view of the acoustic wave device shown in FIG. 1A.
Figure 1C:
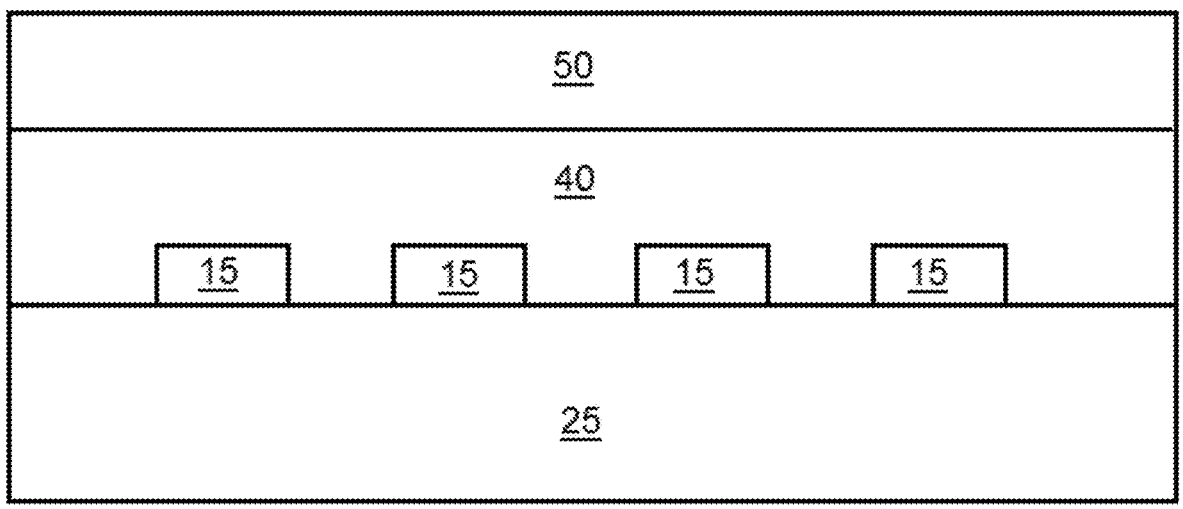
FIG. 1C is a cross-sectional view of another example of an acoustic wave device.

Amorphous thin films are commonly used as components of high-frequency acoustic resonators because they may help control the temperature coefficient of frequency or temperature coefficient of velocity of the high-frequency acoustic resonators. One material used as a temperature-compensating film is silicon dioxide ($SiO_2$). Silicon dioxide can improve the TCF of acoustic wave devices in which it is used because it has a positive temperature coefficient of velocity (TCV), which is measure of how the sound velocity changes with temperature, at near-room temperatures. As shown in FIG. 1C, in addition to the silicon dioxide layer 40, the acoustic wave device may also include a passivation layer 50 of silicon nitride ($Si_3N_4$) over the layer of silicon dioxide. In contrast to silicon dioxide films, silicon nitride films exhibit a negative TCV at near-room temperatures, and may degrade the TCF of the acoustic wave device.

Aspects and embodiments are directed to acoustic wave devices that may exhibit an improved TCF, and in particular, to the use of certain thin film structures in acoustic wave devices to achieve an improved TCF.

Figure 2A:
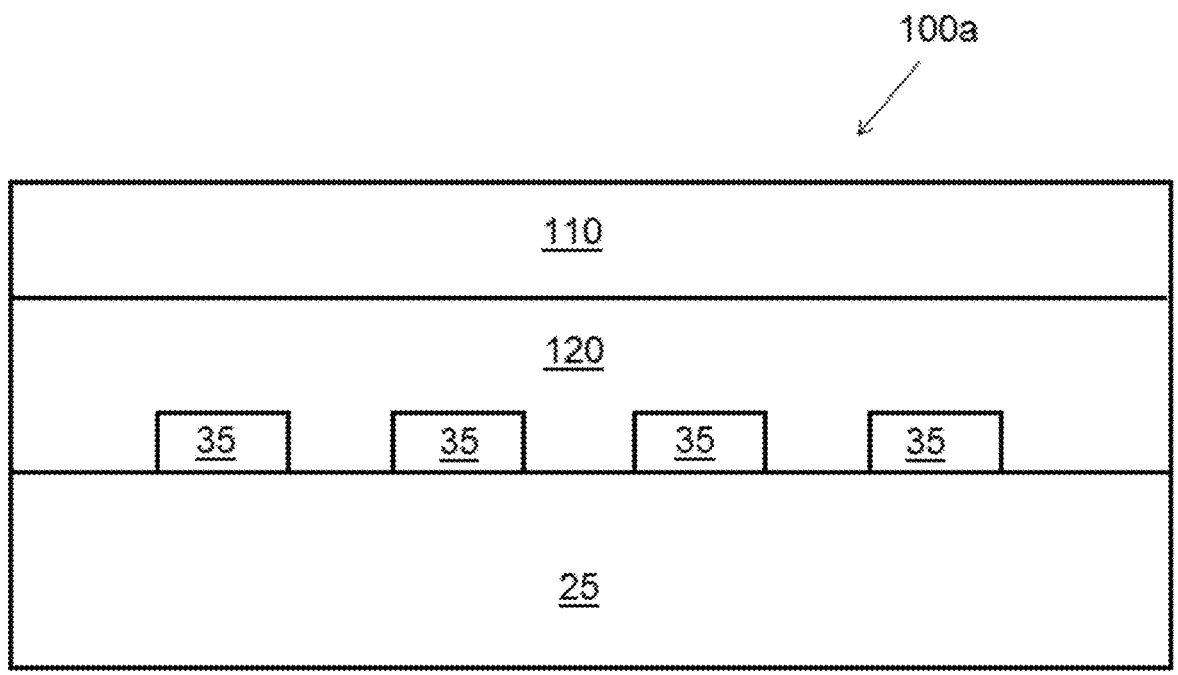
FIG. 2A is a cross-sectional view of another example of an acoustic wave device.
Figure 2B:
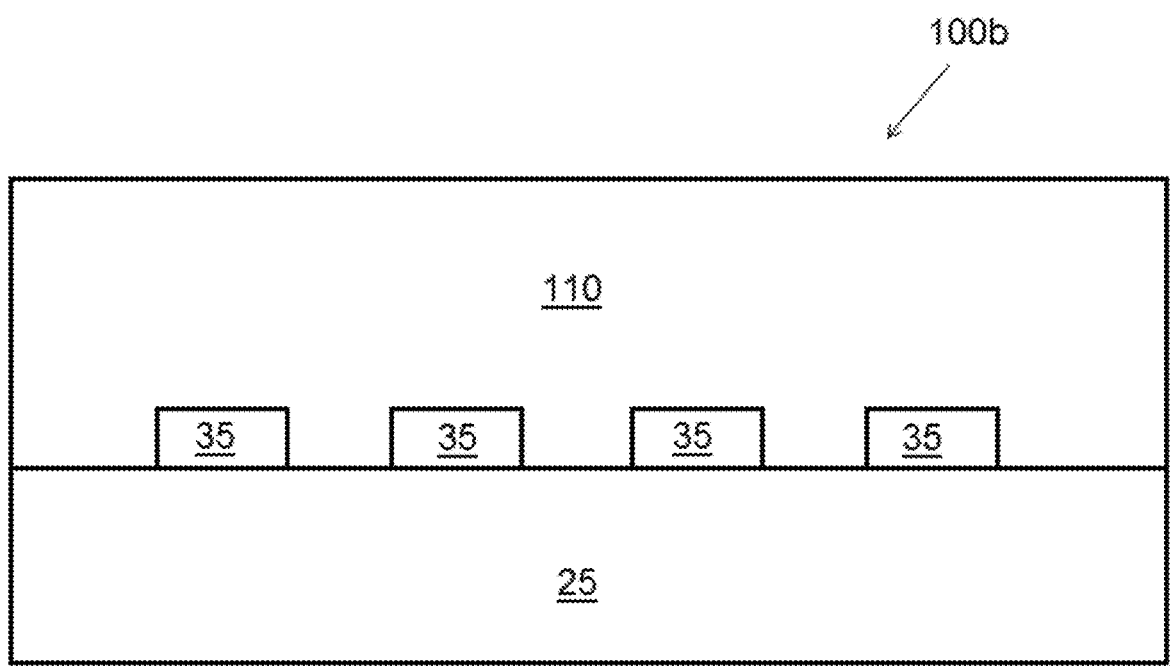
FIG. 2B is a cross-sectional view of another example of an acoustic wave device.

Additives may be used in the temperature-compensating films to further enhance the temperature characteristics of filters in which the acoustic wave devices are used. According to certain aspects, a silicon oxynitride ($SiO_xN_y$) temperature-compensating film can be used, either in combination with a silicon dioxide film or as a replacement for a silicon dioxide film. For example, FIG. 2A illustrates a cross-sectional view of an example of an acoustic wave device 100a in which a silicon oxynitride film 110 is applied over a silicon dioxide film 120. The silicon dioxide film 120 is in direct contact with the IDT electrode fingers 35 and the piezoelectric substrate on the bottom side thereof and in direct contact with the silicon oxynitride film 110 on the top surface thereof. In this example, the silicon oxynitride film 110 replaces the silicon nitride passivation layer 50 shown in FIG. 1C. FIG. 2B illustrates another example of an acoustic wave device 100b in which the silicon oxynitride film 110 is applied directly over the IDT electrode fingers 35 and is in direct contract with the IDT electrode fingers 35 and piezoelectric substrate 25. Silicon oxynitride is silicon to which oxygen and nitrogen are added. Because the TCV of amorphous silicon oxide is opposite in sign to that of silicon nitride, specific compositions of a silicon oxynitride thin film (i.e., having appropriate ratios of oxygen to nitrogen) may exhibit a negligible or even zero TCV, which may be desirable in dielectric films used to coat IDT electrodes in acoustic wave devices. A silicon oxynitride film having a negligible of zero TCV deposited over a silicon dioxide film in an acoustic wave device, for example, as illustrated in FIG. 2A may passivate the silicon dioxide film but not exhibit a TCV that might otherwise degrade the TCF of the acoustic wave device.

The elastic constants of amorphous thin films are often significantly different from those of bulk materials, and therefore the direct measurement of sound velocity and temperature coefficient of velocity (TCV) for individual thin films may be very important in designing resonators. As discussed further below, the longitudinal-wave velocity of silicon oxynitride thin films with various nitride concentrations can be measured using a picosecond ultrasound method.

EXAMPLES

Silicon (100) substrates were coated with silicon oxynitride films having different ratios of oxygen to nitrogen by magnetron sputtering using a silicon target in the presence of oxygen and nitrogen gas. By changing the partial gas pressure of nitrogen to oxygen, the various silicon oxynitride thin films were produced. A 10 nm aluminum thin film was added on the top surface of the silicon oxynitride films for wave excitation and detection with picosecond laser ultrasonics through pump-probe measurement using a picosecond laser, as discussed further below.

The various samples had the following compositions, thicknesses, and refractive indices; the thicknesses and refractive indexes measured with an ellipsometer:

TABLE 1

| Sample | Refractive Index | Thickness (nm) | Oxygen Content (atomic %) | Nitrogen Content (atomic %) | N/(O + N) |
|---|---|---|---|---|---|
| $SiO_{1.89}N_{0.07}$ | 1.53 | 1150 | 64.28 | 2.32 | 0.035 |
| $SiO_{1.77}N_{0.11}$ | 1.57 | 1133 | 61.16 | 3.82 | 0.059 |
| $SiO_{1.71}N_{0.19}$ | 1.61 | 1111 | 58.95 | 6.6 | 0.101 |
| $SiO_{1.24}N_{0.44}$ | 1.71 | 1064 | 46.38 | 12.27 | 0.260 |

TABLE 1-continued

| Sample | Refractive Index | Thickness (nm) | Oxygen Content (atomic %) | Nitrogen Content (atomic %) | N/(O + N) |
|---|---|---|---|---|---|
| $SiO_{0.94}N_{0.63}$ | 1.79 | 1040 | 36.52 | 24.56 | 0.402 |
| $SiO_{0.67}N_{0.83}$ | 1.87 | 1030 | 26.85 | 33.09 | 0.552 |
| Si—O—N | 1.7 | 933 | 50 | 50 | 0.5 |

As indicated in TABLE 1 above, the refractive indices of the silicon oxynitride films were between those of silicon dioxide and silicon nitride, and increased with increasing nitrogen content.

An ultrashort (picosecond) pulse laser was used to excite acoustic waves in the silicon oxynitride film samples and the changes in reflectance of the film samples were observed. In particular, an 800-nm pump light pulse with a 200-fs duration was focused on the thin film surfaces to generate a high-frequency longitudinal wave, which propagated in the film-thickness direction, with repeated reflections between the film surfaces and interfaces with the silicon substrate. A time-delayed pump light pulse with a 400 nm wavelength was then applied to the surfaces of the silicon oxynitride film samples to detect diffracted light from the acoustic pulse. The reflectivity change of the probe light pulse reflects the strain field inside the thin film, from which the sound velocity can be determined.

The acoustic velocities of the sample films were measured using both the Brillouin oscillation method and the pulse-echo method. The acoustic velocities measured by the two methods matched well and are reflected in TABLE 2 below. The acoustic velocity for each sample was between that for silicon dioxide and silicon nitride, and increased with increasing nitrogen concentration.

TABLE 2

| Sample | Velocity Measured by Pulse-Echo Method (m/s) | Velocity Measured by Brillouin Oscillation Method (m/s) |
|---|---|---|
| $SiO_{1.89}N_{0.07}$ | 6648 ± 6 | 6852 ± 7 |
| $SiO_{1.77}N_{0.11}$ | 6967 ± 2 | 7116 ± 27 |
| $SiO_{1.71}N_{0.19}$ | 7281 ± 2 | 7476 ± 8 |
| $SiO_{1.24}N_{0.44}$ | 8046 ± 4 | 8356 ± 15 |
| $SiO_{0.94}N_{0.63}$ | 8556 ± 2 | 8834 ± 21 |
| $SiO_{0.67}N_{0.83}$ | 9000 ± 1 | 9442 ± 32 |
| Si—O—N | 8150 ± 2 | 8383 ± 21 |

Figure 3:
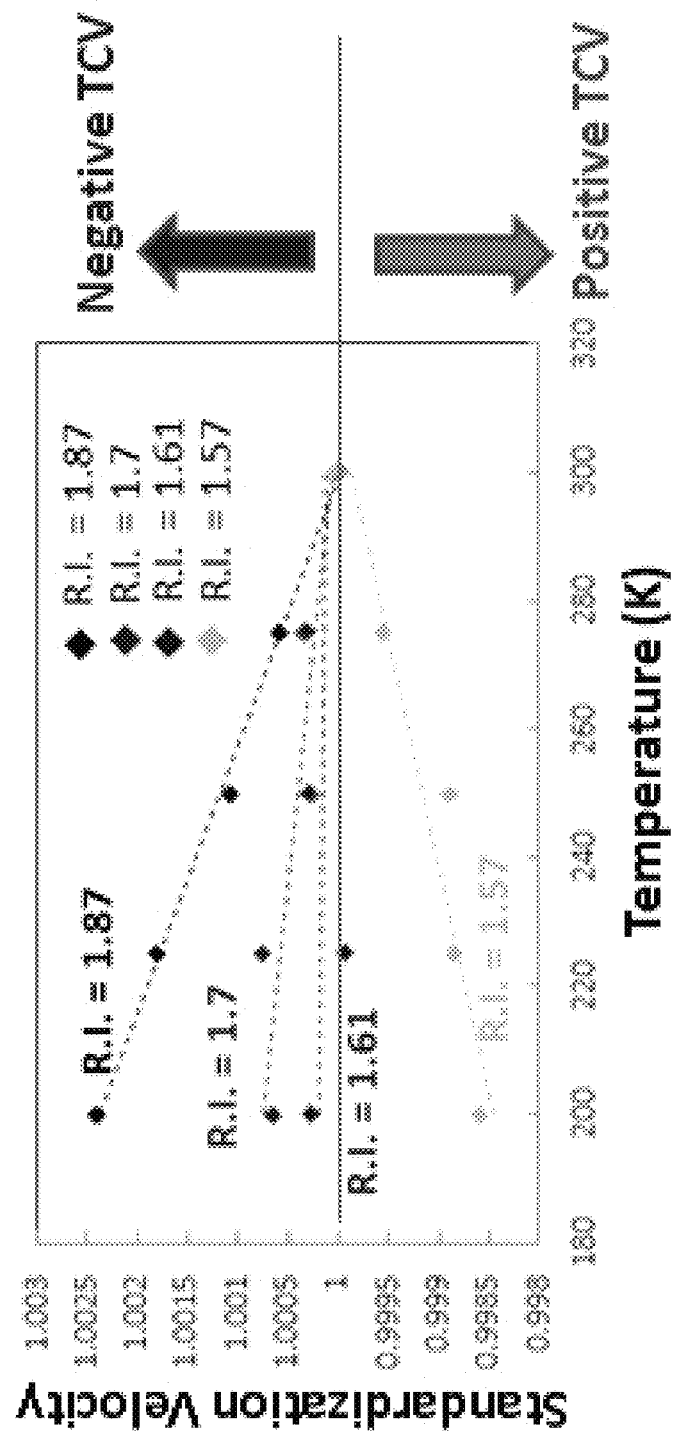
FIG. 3 is a graph illustrating change in acoustic velocity with temperature for different silicon oxynitride film samples.
Figure 4:
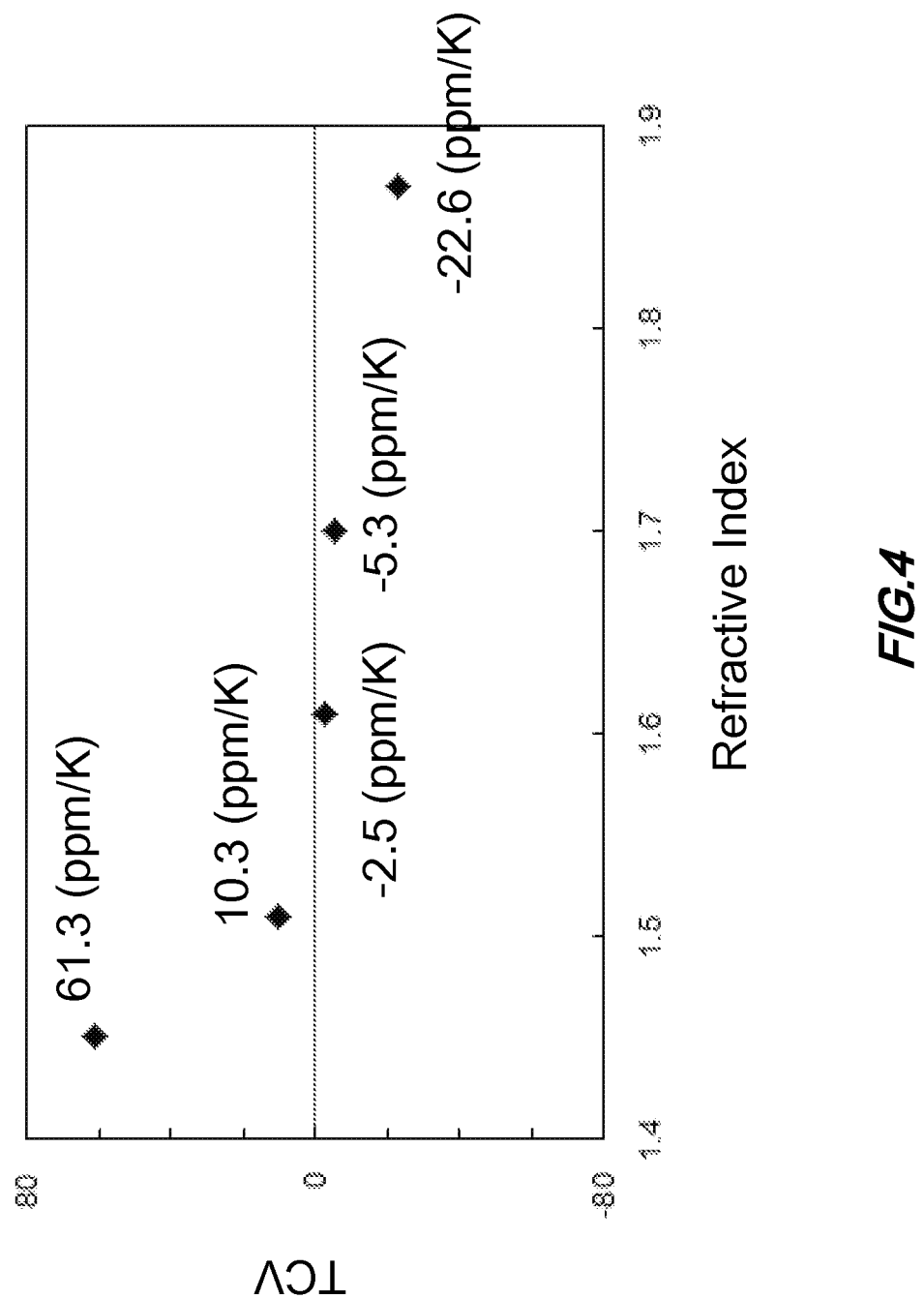
FIG. 4 is a graph illustrating thermal coefficient of velocity as a function of refractive index for different silicon oxynitride film samples.

The change in acoustic velocity with temperature for samples with different refractive indices was measured. These results are illustrated in FIG. 3. The TCV for samples with different refractive indices was also measured at room temperature. These results are illustrated in FIG. 4.

These results show that the TCV of silicon oxynitride films has a dependence on the refractive index and composition of the silicon oxynitride films. In particular, silicon oxynitride films with a refractive index above about 1.61 or a N/(O+N) composition greater than about 0.1 have a negative TCV, and silicon oxynitride films with a refractive index below about 1.57 or a N/(O+N) composition of less than about 0.1 have a positive TCV. In addition, silicon oxynitride films having a particular chemical content and associated refractive index may have a very small TCV. Specifically, silicon oxynitride films with N/(O+N) compositions of about 0.1, or in a range of approximately 0.1 to 0.26, or refractive indices of about 1.6, or in a range of approximately 1.61 to 1.7 exhibit negligible TCV at room temperature (between zero and about −5.3 ppm/degree K) and may be a desirable dielectric to use to coat IDT electrodes of acoustic wave devices. For example, by using a silicon oxynitride film with a refractive index in the range of 1.61 to 1.7 or a N/(O+N) composition of about 0.1 or in a range of approximately 0.1 to 0.26 in acoustic wave devices such as those shown in FIGS. 2A and 2B, TCF degradation of the acoustic wave devices may be decreased because a silicon oxynitride film having a refractive index or composition in these ranges exhibits a negligible TCV. A negligible or substantially zero TCV as the terms are used herein may refer to films having a TCV of between −5 ppm/degree K and 5 ppm/degree K or between −2.5 ppm/degree K and 2.5 ppm/degree K. Further, by using a silicon oxynitride film having a refractive index below about 1.57 or a N/(O+N) composition of less than about 0.1 in an acoustic wave device as illustrated in either FIG. 2A or 2B, TCF degradation of the acoustic wave device may be improved because such silicon oxynitride films exhibit a positive TCV which may at least partially compensate for the negative TCV of typical piezoelectric substrates.

As discussed above, acoustic wave devices such as those shown in FIGS. 2A and 2B, including silicon oxynitride films according to various aspects, may be used in filters in a wide range of electronic devices.

Figure 5:
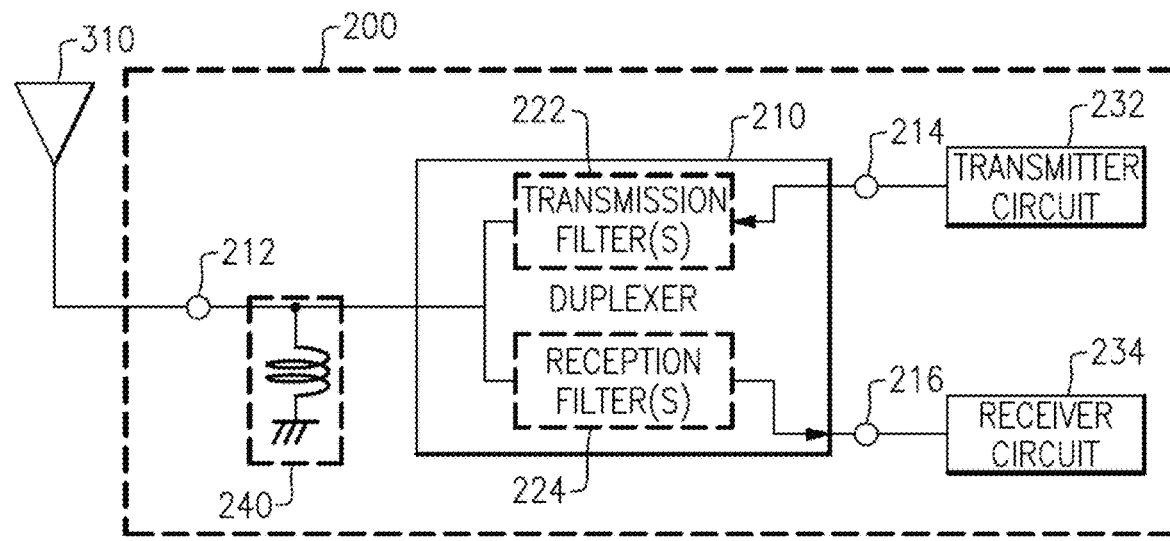
FIG. 5 is a block diagram of an example of a module which may be used in an electronic device.

Referring to FIG. 5, there is illustrated a block diagram of one example of a front-end module 200, which may be used in an electronic device such as a wireless communications device (e.g., a mobile phone) for example. The front-end module 200 includes an antenna duplexer 210 having a common node 212, an input node 214, and an output node 216. An antenna 310 is connected to the common node 212. The front-end module 200 further includes a transmitter circuit 232 connected to the input node 214 of the duplexer 210 and a receiver circuit 234 connected to the output node 216 of the duplexer 210. The transmitter circuit 232 can generate signals for transmission via the antenna 310, and the receiver circuit 234 can receive and process signals received via the antenna 310. In some embodiments, the receiver and transmitter circuits are implemented as separate components, as shown in FIG. 5; however in other embodiments these components may be integrated into a common transceiver circuit or module. As will be appreciated by those skilled in the art, the front-end module 200 may include other components that are not illustrated in FIG. 5 including, but not limited to, switches, electromagnetic couplers, amplifiers, processors, and the like.

The antenna duplexer 210 may include one or more transmission filters 222 connected between the input node 214 and the common node 212, and one or more reception filters 224 connected between the common node 212 and the output node 216. The passband(s) of the transmission filter(s) are different from the passband(s) of the reception filters. Each of the transmission filter(s) 222 and the reception filter(s) 224 may include an embodiment of an acoustic wave device as disclosed herein. An inductor or other matching component 240 may be connected at the common node 212.

In certain examples, the acoustic wave elements used in the transmission filter 222 or the reception filter 224 are disposed on a single piezoelectric substrate. This structure reduces the effect of changes in temperature upon the frequency responses of the respective filter, in particular, reducing degradation in the passing or attenuation characteristics due to changes in the temperature, because each acoustic wave element changes similarly in response to changes in the ambient temperature. In addition, this arrangement may also allow the transmission filter 222 or reception filter 224 to have a small size.

Figure 6:
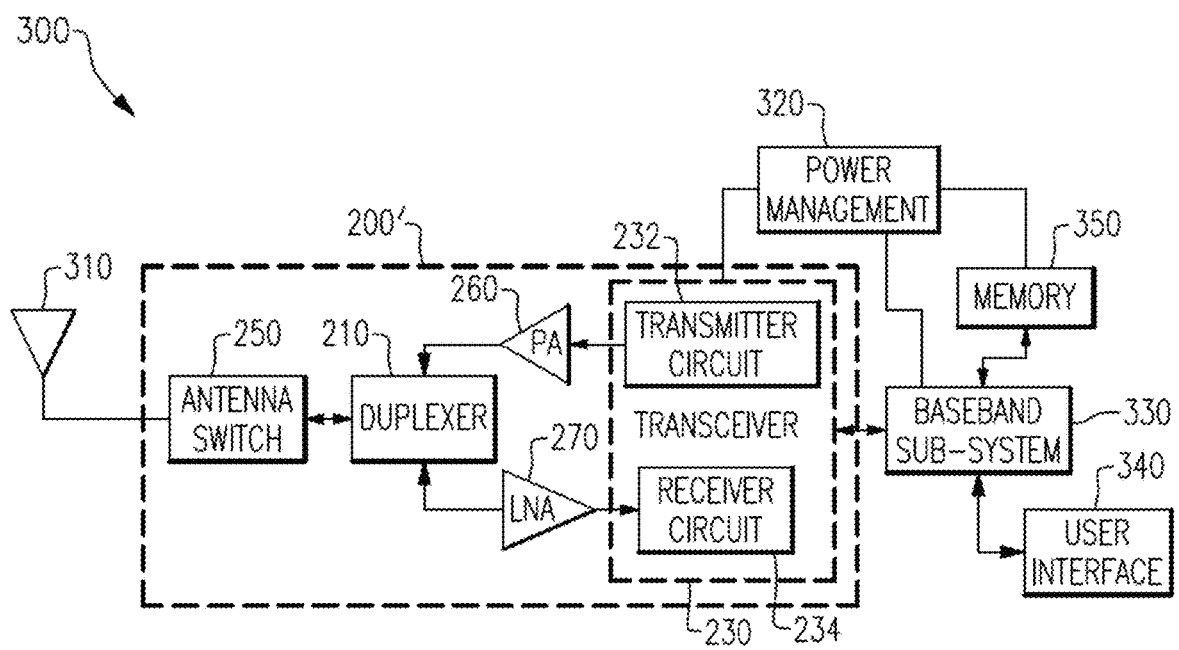
FIG. 6 is a block diagram of an embodiment of a wireless device.

FIG. 6 is a block diagram of one example of a wireless device 300 including the antenna duplexer 210 shown in FIG. 5. The wireless device 300 can be a cellular phone, smart phone, tablet, modem, communication network or any other portable or non-portable device configured for voice or data communication. The wireless device 300 can receive and transmit signals from the antenna 310. The wireless device includes an embodiment of a front-end module 200' similar to that discussed above with reference to FIG. 5. The front-end module 200' includes the duplexer 210, as discussed above. In the example shown in FIG. 6 the front-end module 200' further includes an antenna switch 250, which can be configured to switch between different frequency bands or modes, such as transmit and receive modes, for example. In the example illustrated in FIG. 6, the antenna switch 250 is positioned between the duplexer 210 and the antenna 310; however, in other examples the duplexer 210 can be positioned between the antenna switch 250 and the antenna 310. In other examples the antenna switch 250 and the duplexer 210 can be integrated into a single component.

The front end module 200' includes a transceiver 230 that is configured to generate signals for transmission or to process received signals. The transceiver 230 can include the transmitter circuit 232, which can be connected to the input node 214 of the duplexer 210, and the receiver circuit 234, which can be connected to the output node 216 of the duplexer 210, as shown in the example of FIG. 5.

Signals generated for transmission by the transmitter circuit 232 are received by a power amplifier (PA) module 260, which amplifies the generated signals from the transceiver 230. The power amplifier module 260 can include one or more power amplifiers. The power amplifier module 260 can be used to amplify a wide variety of RF or other frequency-band transmission signals. For example, the power amplifier module 260 can receive an enable signal that can be used to pulse the output of the power amplifier to aid in transmitting a wireless local area network (WLAN) signal or any other suitable pulsed signal. The power amplifier module 260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 260 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 6, the front-end module 200' may further include a low noise amplifier module 270, which amplifies received signals from the antenna 310 and provides the amplified signals to the receiver circuit 234 of the transceiver 230.

The wireless device 300 of FIG. 6 further includes a power management sub-system 320 that is connected to the transceiver 230 and manages the power for the operation of the wireless device 300. The power management system 320 can also control the operation of a baseband sub-system 330 and various other components of the wireless device 300. The power management system 320 can include, or can be connected to, a battery (not shown) that supplies power for the various components of the wireless device 300. The power management system 320 can further include one or more processors or controllers that can control the transmission of signals, for example. In one embodiment, the baseband sub-system 330 is connected to a user interface 340 to facilitate various input and output of voice and/or data provided to and received from the user. The baseband sub-system 330 can also be connected to memory 350 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only.

What is claimed is:

1. An acoustic wave device comprising:
   a piezoelectric substrate;
   a pair of interleaved interdigital transducer electrodes disposed on the piezoelectric substrate; and
   a dielectric film including silicon oxynitride and exhibiting an acoustic velocity of between about 7300 m/s and 8200 m/s covering the pair of interleaved interdigital transducer electrodes and exhibiting a temperature coefficient of velocity of substantially zero throughout an operating temperature range of the acoustic wave device of between −55° C. and 125° C.

2. The acoustic wave device of claim 1 further including a second dielectric film disposed between the dielectric film including silicon oxynitride and the pair of interleaved interdigital transducer electrodes.

3. The acoustic wave device of claim 2 wherein the second dielectric film exhibits a temperature coefficient of velocity having a sign opposite to a temperature coefficient of velocity of the piezoelectric substrate.

4. The acoustic wave device of claim 3 wherein the temperature coefficient of velocity of the second dielectric film is positive.

5. The acoustic wave device of claim 3 wherein the second dielectric film exhibits the temperature coefficient of velocity having the sign opposite to the temperature coefficient of velocity of the piezoelectric substrate throughout the operating temperature range of the acoustic wave device.

6. The acoustic wave device of claim 5 wherein the temperature coefficient of velocity of the second dielectric film is more negative than the temperature coefficient of velocity of the dielectric film including silicon oxynitride.

7. The acoustic wave device of claim 5 wherein the second dielectric film comprises silicon dioxide.

8. The acoustic wave device of claim 2 wherein the second dielectric film is in direct contact with the pair of interleaved interdigital transducer electrodes.

9. The acoustic wave device of claim 8 wherein the second dielectric film is in direct contact with the dielectric film including silicon oxynitride.

10. The acoustic wave device of claim 8 wherein the second dielectric film is in direct contact with the piezoelectric substrate.

11. The acoustic wave device of claim 1 wherein the acoustic wave device is one of a resonator and a filter.

12. The acoustic wave device of claim 11 wherein the acoustic wave device is one of a radio frequency resonator and a radio frequency filter.

13. The acoustic wave device of claim 1 included in an electronic device module.

14. The acoustic wave device of claim 13 wherein the electronic device module is a radio frequency device module.

15. The acoustic wave device of claim 14 included in an electronic device.

16. An acoustic wave device comprising:
a piezoelectric substrate;
a pair of interleaved interdigital transducer electrodes disposed on the piezoelectric substrate; and
a film of silicon oxynitride disposed directly on the pair of interleaved interdigital transducer electrodes and having a N/(N+O) ratio of less than or equal to 0.1, N being the atomic percentage of nitrogen in the dielectric film and O being the atomic percentage of oxygen in the dielectric film.

17. The acoustic wave device of claim 16 wherein the film of silicon oxynitride has a positive temperature coefficient of velocity.

18. A method of forming an acoustic wave device, the method comprising:
forming a pair of interleaved interdigital transducer electrodes on a piezoelectric substrate; and
depositing a dielectric film including silicon oxynitride over the pair of interleaved interdigital transducer electrodes, the dielectric film exhibiting an acoustic velocity of between about 7300 m/s and 8200 m/s and a temperature coefficient of velocity of substantially zero throughout an operating temperature range of the acoustic wave device of between −55° C. and 125° C.

19. The method of claim 18 further comprising forming a silicon dioxide film between the dielectric film and the pair of interleaved interdigital transducer electrodes.

* * * * *

UNITED STATES PATENT AND TRADEMARK OFFICE
CERTIFICATE OF CORRECTION

| | | |
|---|---|---|
| PATENT NO. | : 11,522,515 B2 | |
| APPLICATION NO. | : 15/922355 | |
| DATED | : December 6, 2022 | |
| INVENTOR(S) | : Satoru Matsuda et al. | |

It is certified that error appears in the above-identified patent and that said Letters Patent is hereby corrected as shown below:

On the Title Page

(72) Inventors: delete "Satoru Matsuda, Toyonaka (JP); Atsushi Nishimura, Nishinomiya (JP); Yoshiro Kabe, Kobe (JP)" and insert -- Satoru Matsuda, Toyonaka-Shi (JP); Atsushi Nishimura, Nishinomiya-Shi (JP); Yoshiro Kabe, Kobe-Shi (JP) --

Signed and Sealed this
Thirty-first Day of January, 2023

Katherine Kelly Vidal
*Director of the United States Patent and Trademark Office*